United States Patent
Wyant et al.

(10) Patent No.: US 12,512,416 B2
(45) Date of Patent: Dec. 30, 2025

(54) LASER ABLATION FOR DIE SEPARATION TO REDUCE LASER SPLASH AND ELECTRONIC DEVICE

(71) Applicant: Texas Instruments Incorporated, Dallas, TX (US)

(72) Inventors: Michael Todd Wyant, Dallas, TX (US); Joseph O. Liu, Plano, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 577 days.

(21) Appl. No.: 17/826,764

(22) Filed: May 27, 2022

(65) Prior Publication Data

US 2023/0387036 A1    Nov. 30, 2023

(51) Int. Cl.
| | |
|---|---|
| H01L 23/544 | (2006.01) |
| H01L 21/268 | (2006.01) |
| H01L 21/56 | (2006.01) |
| H01L 21/66 | (2006.01) |
| H01L 23/00 | (2006.01) |
| H01L 23/31 | (2006.01) |
| H01L 23/495 | (2006.01) |

(52) U.S. Cl.
CPC .......... *H01L 23/544* (2013.01); *H01L 21/268* (2013.01); *H01L 21/56* (2013.01); *H01L 22/12* (2013.01); *H01L 23/3107* (2013.01); *H01L 23/495* (2013.01); *H01L 24/48* (2013.01); *H01L 2223/5446* (2013.01); *H01L 2224/48245* (2013.01)

(58) Field of Classification Search
CPC ....... H01L 21/268; H01L 21/56; H01L 22/12; H01L 23/3107; H01L 23/495; H01L 24/48

USPC ......................................................... 257/666
See application file for complete search history.

(56) References Cited

U.S. PATENT DOCUMENTS

| | | | | |
|---|---|---|---|---|
| 6,828,810 B2 * | 12/2004 | Kanamaru | ........... | G01R 1/0491 |
| | | | | 324/750.25 |
| 7,804,312 B2 * | 9/2010 | Lee | .................... | G01R 1/07342 |
| | | | | 324/754.07 |
| 8,381,967 B1 | 2/2013 | Masumoto et al. | | |
| 8,836,093 B2 * | 9/2014 | Tan | ........................ | H01L 23/495 |
| | | | | 257/676 |
| 9,219,052 B2 * | 12/2015 | Partosa | ................... | H01L 24/73 |

(Continued)

OTHER PUBLICATIONS

Ankit Gupta and Katelyn Wiggenhorn "Enhanced HotRod QFN Package: Achieving Low EMI Performance in Industry's Smallest 4-A Converter", Texas Instruments Application Report SNVA935 Jun. 2020.

*Primary Examiner* — Sue A Purvis
(74) *Attorney, Agent, or Firm* — Ronald O. Neerings; Frank D. Cimino

(57) ABSTRACT

A method includes performing a laser ablation process that removes a portion of a wafer to form a trench in a scribe region between adjacent die regions of the wafer, the trench extending from a first side of the wafer toward an opposite second side of the wafer, the trench extending through a metallization structure and an active circuit portion of the wafer, and a bottom of the trench spaced apart from the second side of the wafer. The method also includes performing a wafer expansion process that separates individual semiconductor dies from the wafer after the laser ablation process.

24 Claims, 13 Drawing Sheets

(56) References Cited

U.S. PATENT DOCUMENTS

| | | | |
|---|---|---|---|
| 10,403,520 B2* | 9/2019 | Jang | H01L 21/78 |
| 2003/0122550 A1* | 7/2003 | Kanamaru | G01R 1/0466 |
| | | | 324/537 |
| 2005/0077913 A1* | 4/2005 | Watkins | G01R 1/07357 |
| | | | 324/756.03 |
| 2005/0202651 A1* | 9/2005 | Akram | B28D 1/221 |
| | | | 438/463 |
| 2008/0003718 A1 | 1/2008 | Estepa et al. | |
| 2008/0012588 A1* | 1/2008 | Lee | G01R 1/07342 |
| | | | 324/756.04 |
| 2011/0124180 A1* | 5/2011 | Abe | H01L 21/67092 |
| | | | 257/E21.599 |
| 2011/0193200 A1* | 8/2011 | Lyne | H01L 22/20 |
| | | | 438/18 |
| 2014/0197534 A1 | 7/2014 | Maldan et al. | |
| 2014/0248746 A1 | 9/2014 | Partosa et al. | |
| 2019/0206752 A1 | 7/2019 | Bautista, Jr. et al. | |
| 2019/0385911 A1 | 12/2019 | Cayabyab et al. | |

* cited by examiner

LASER ABLATION FOR DIE SEPARATION TO REDUCE LASER SPLASH AND ELECTRONIC DEVICE

BACKGROUND

Die singulation or dicing involves separating individual semiconductor dies from a wafer. Laser cutting or laser dicing can be used to cut the wafer, but this can lead to uncontrolled crack propagation. Laser reflection off crack surfaces at uncontrolled angles causes damage referred to as laser splash. Laser splash can damage active circuitry of a die and may lead to die un-separation and chipping or meander faults where the cutting line breaches the device scribe seal, resulting in reduced product yield. Moreover, the laser splash damage occurs after wafer probe testing and dies subjected to laser splash cannot be identified until final device testing after the cost of packaging has been incurred.

SUMMARY

In one aspect, an electronic device includes a semiconductor die with a mark and a conductive feature, a conductive lead electrically connected to the conductive feature of the semiconductor die, and a package structure that encloses a portion of the semiconductor die and exposes a portion of the conductive lead. The semiconductor die has opposite first and second sides, a third side, an active circuit portion, a metallization structure, and the conductive feature on the first side. The third side extends between the first and second sides, the metallization structure extends between the first side and the active circuit portion, the active circuit portion extends between the metallization structure and the second side, and the active circuit portion is spaced apart from the second side. The mark extends on the third side of the semiconductor die from the first side toward the second side. The mark extends along the metallization structure and the active circuit portion, and the mark is spaced apart from the second side.

In another aspect, a method of fabricating an electronic device includes performing a laser ablation process, performing a wafer probe test, performing a wafer expansion process, and packaging a semiconductor die to form an electronic device. The laser ablation process removes a portion of a wafer to form a trench in a scribe region between adjacent die regions of the wafer. The trench extends from a first side of the wafer toward an opposite second side of the wafer and the trench extends through a metallization structure and an active circuit portion of the wafer, with a bottom of the trench spaced apart from the second side of the wafer. The wafer probe test is performed after the laser ablation process to test circuitry of the active circuit portion of the wafer. After the wafer probe test, the wafer expansion process is performed to separate individual semiconductor dies from the wafer, and one of the semiconductor dies is packaged in a package structure to form the electronic device.

In a further aspect, a method of separating semiconductor dies from a wafer includes performing a laser ablation process that removes a portion of a wafer to form a trench in a scribe region between adjacent die regions of the wafer, where the trench extends from a first side of the wafer toward an opposite second side and the trench extends through a metallization structure and an active circuit portion of the wafer, with a bottom of the trench spaced apart from the second side of the wafer. After the laser ablation process, the method includes performing a wafer expansion process that separates individual semiconductor dies from the wafer.

DETAILED DESCRIPTION

Figure 1:
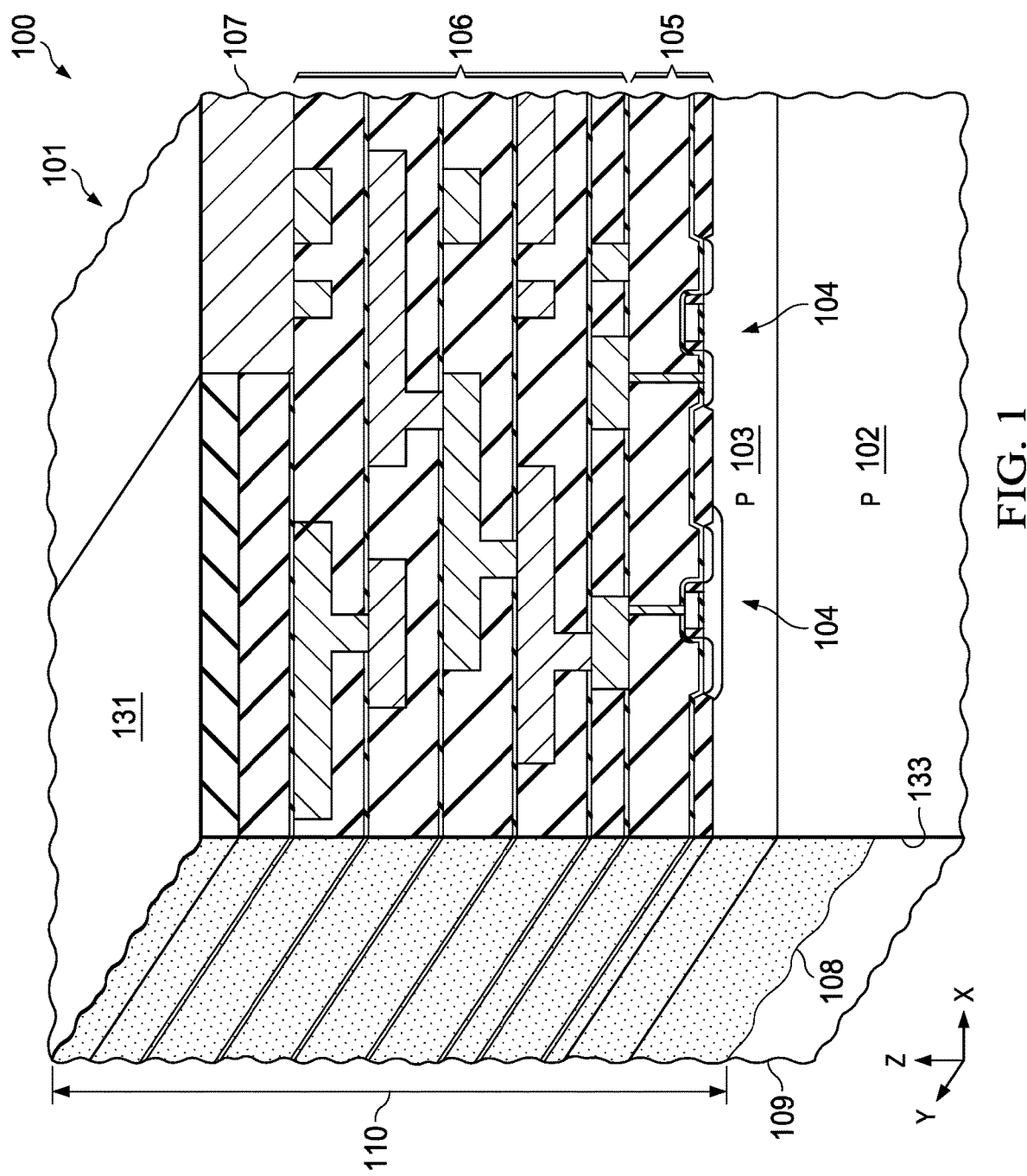
FIG. 1 is a partial sectional perspective view of an electronic device and a semiconductor die thereof.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
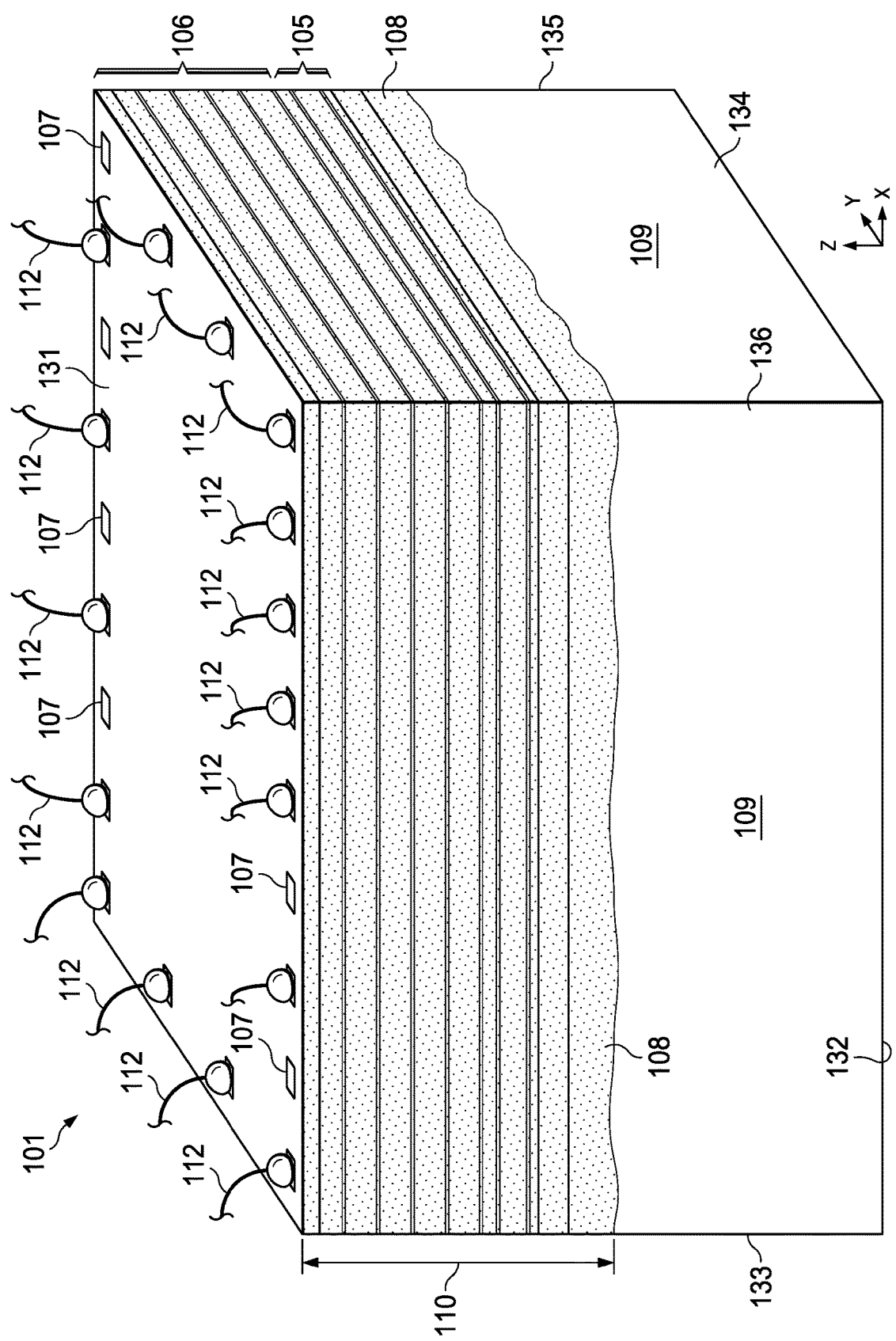
FIG. 1A is a perspective view of the semiconductor die of FIG. 1.
Figure 1B:
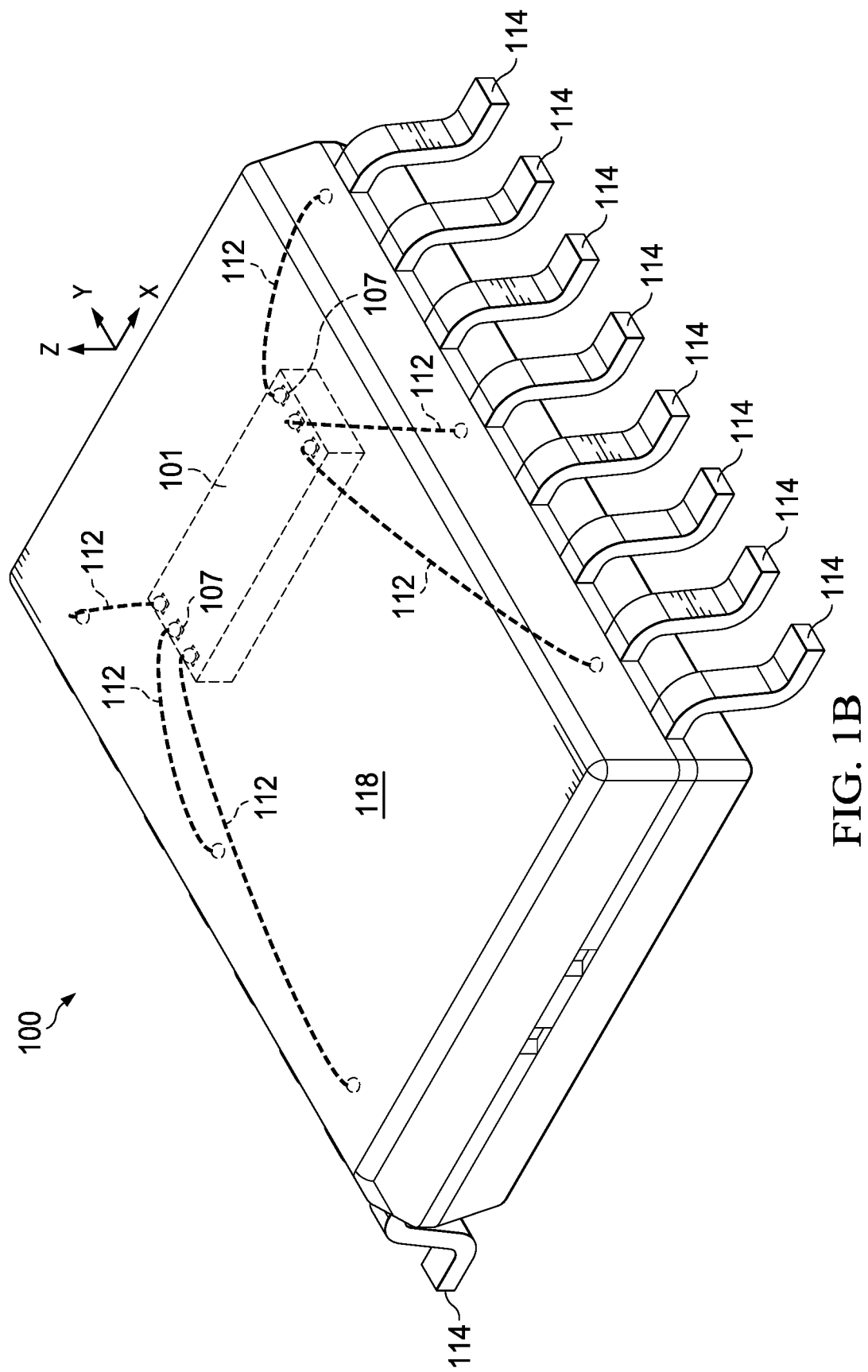
FIG. 1B is a perspective view of the electronic device of FIG. 1.

FIGS. 1-1B show an electronic device 100 with a semiconductor die 101. FIG. 1 shows a partial sectional perspective view of the electronic device 100 and the semiconductor die 101, FIG. 1A shows a perspective view of the semiconductor die 101 and FIG. 1B shows a perspective view of the electronic device 100. The electronic device 100 is fabricated using laser ablation to mitigate or avoid laser splash damage, and the fabrication process provides a solution that allows wafer probe testing after the laser ablation to identify any laser damage before incurring the cost of packaging. The semiconductor die 101 includes first and second semiconductor layers 102 and 103, including a semiconductor substrate layer 102 and a semiconductor surface layer 103 on the semiconductor substrate layer 102. The semiconductor layers 102 and 103 include semiconductor material (e.g., silicon, gallium nitride, etc.) doped by implantation and/or diffusion with dopants of a first conductivity type (e.g., p). In another implementation (not shown), one or both of the semiconductor layers 102 and/or 103 can be doped with dopants of an opposite second conductivity type (e.g., n). The electronic device 100 includes one or more electronic components such as transistors 104 that are formed on and/or in the semiconductor surface layer 103 in an active circuit portion 105 of the semiconductor die 101. The active circuit portion 105 also includes isolation structures (e.g., shallow trench isolation or STI structures, field oxide structures, etc.) and tungsten (W) or other conductive contacts that extend through a pre-metal dielectric (PMD) dielectric layer to form electrical contacts or connections to terminals (e.g., gate, source, drain) of the transistors 104. The semiconductor die 101 also includes a multilevel metallization structure 106 that extends above the PMD level. The metallization structure 106 includes stacked dielectric layers with metal vias and lines (e.g., copper, aluminum, etc.) for interconnections and signal routing, as well as conductive features 107 such as metal bond pads for bond wire connections, copper pillars for flip-chip connections, etc.

As best shown in FIGS. 1 and 1A, the semiconductor die 101 has a mark 108 on upper portions of the lateral sides thereof, and the lateral sides have lower unmarked portions 109. The mark 108 extends along the metallization structure 106 and the active circuit portion 105. In the illustrated example, the mark 108 extends on and below the semiconductor surface layer 103 of the active circuit portion 105 and onto sides of the upper portion of the semiconductor substrate layer 102. A portion of the mark 108 extends past the active circuit portion 105 along the lateral sides between the active circuit portion 105 and the bottom of the semiconductor die 101. The mark 108 extends to an average distance 110 of 20 μm or more and 25 μm or less downward from the top side of the semiconductor die 101. The mark 108 is visually distinguishable from an unmarked portion 109 of the lateral sides. In one example, the mark 108 is generally uniform and darker than the unmarked portion 109 and the difference allows visual inspection or camera inspection to detect the presence of the mark 108 as distinct from the unmarked portion 109. In the illustrated example, the mark 108 has a curvilinear bottom, although not a strict requirement of all possible implementations. The mark 108 in FIGS. 1-1B extends along all four lateral sides of the rectangular semiconductor die 101. In other implementations, the mark 108 extends on fewer than all lateral sides of the semiconductor die 101. The mark 108 in the illustrated example results from laser ablation processing during fabrication of the electronic device 100 as discussed further below, and the mark 108 extends downward to the average distance 110 that corresponds to an average trench depth created by laser ablation during manufacturing.

As further shown in FIGS. 1A and 1B, the conductive features 107 in the illustrated example are copper bond pads and the electronic device 100 includes bond wires 112 electrically and mechanically connected to respective ones of the conductive features 107 of the semiconductor die 101. The electronic device 100 includes conductive metal leads 114. Portions of the conductive leads 114 are exposed outside a molded package structure 118 that encloses all or portions of the semiconductor die 101 and interior portions of the conductive leads 114. In the illustrated example, the electronic device 100 includes leads 114 along two opposite lateral sides of the package structure 118. In other implementations, conductive leads can extend along more or fewer than two lateral sides of the package structure 118. The illustrated electronic device 100 has gullwing type leads 114. Other types and forms of conductive leads can be used in other implementations, such as J-style leads that extend at least partially outward from the package structure 118, and/or conductive metal lead structures that do not extend outward from the side or bottom of the package structure, for example, in a no-lead device (quad flat no-lead or QFN device, dual flat no-lead or DFN device, etc., not shown). The electronic device 100 is illustrated in FIGS. 1-1B in a three-dimensional with respective first, second, and third mutually orthogonal directions X, Y, and Z.

As best shown in FIG. 1A, the semiconductor die 101 has opposite first and second (e.g., top and bottom) sides 131 and 132 that extend in respective capital X-Y planes and the first and second sides 131 and 132 are spaced apart from one another along the third direction Z in the illustrated orientation of the electronic device 100. The electronic device 100 also includes laterally opposite third and fourth sides 133 and 134 that are generally planar in respective Y-Z planes and are spaced apart from one another along the first direction X, as well as laterally opposite fifth and sixth sides 135 and 136 that extend in respective X-Z planes and are spaced apart from one another along the second direction Y. The mark 108 extends along the third, fourth, fifth, and sixth sides 133-136 from the first side 131 toward the second side 132. The mark 108 extends along the metallization structure 106 and the active circuit portion 105, and the mark 108 is spaced apart from the second side 132. As shown in FIG. 1, a portion of the mark 108 extends past the active circuit portion 105 along the third side 133 between the active circuit portion 105 and the second side 132 to the average distance 110 (e.g., 20 μm or more and 25 μm or less) downward from the first side 131 toward the second side 132, and the mark 108 extends in similar fashion along the other lateral sides 134-136. The conductive features 107 are exposed on the first side 131, the metallization structure 106 extends between the first side 131 and the active circuit portion 105, the active circuit portion 105 extends between the metallization structure 106 and the second side 132, and the active circuit portion 105 is spaced apart from the second side 132. One or more of the conductive leads 114 are electrically connected by respective bond wires 112 to corresponding conductive features 107 of the semiconductor die 101, and the package structure 118 encloses a portion of the semiconductor die 101 and exposes a portion of the conductive leads 114.

Referring now to FIGS. 2-7, FIG. 2 shows a method 200 of fabricating an electronic device with an included die separation method, and FIGS. 3-9 show the electronic device 100 undergoing fabrication processing according to the method 200. The method 200 employs laser ablation processing to create trenches in a processed semiconductor wafer, followed by wafer probe testing and subsequent wafer expansion processing that separates individual semiconductor dies 101 from the wafer. The method 200 facilitates early identification of circuit damage resulting from the laser ablation processing, and also mitigates or avoids laser splash and associated product yield problems.

Figure 2:
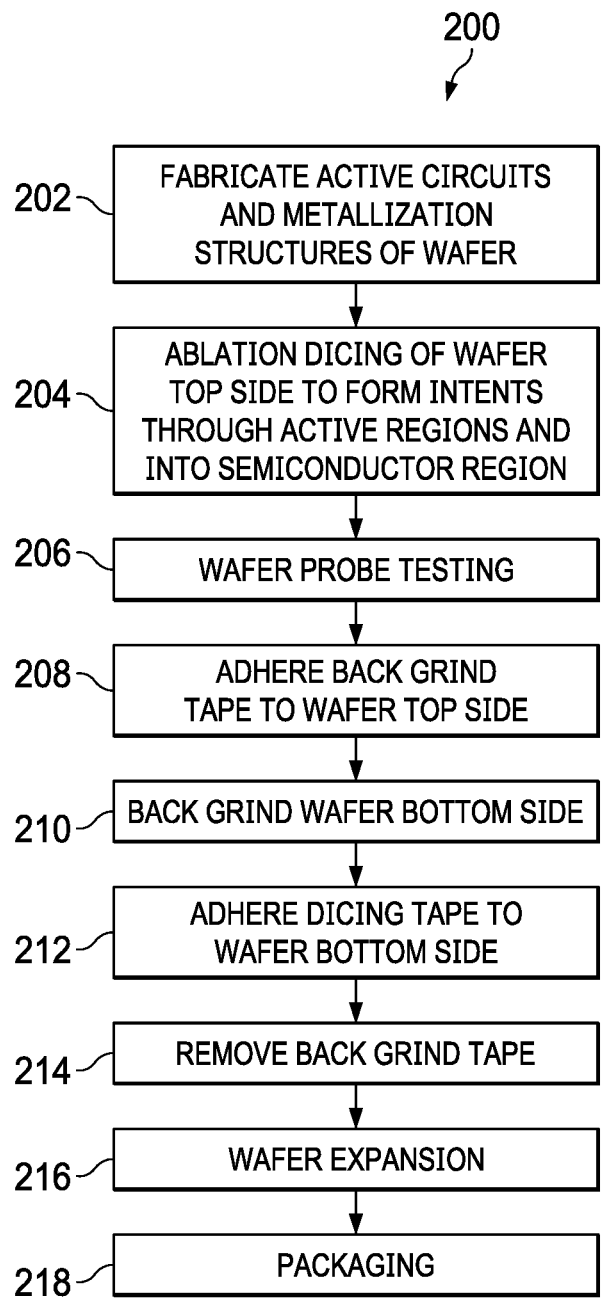
FIG. 2 is a flow diagram of a method of fabricating an electronic device with an included die separation method.
Figure 3:
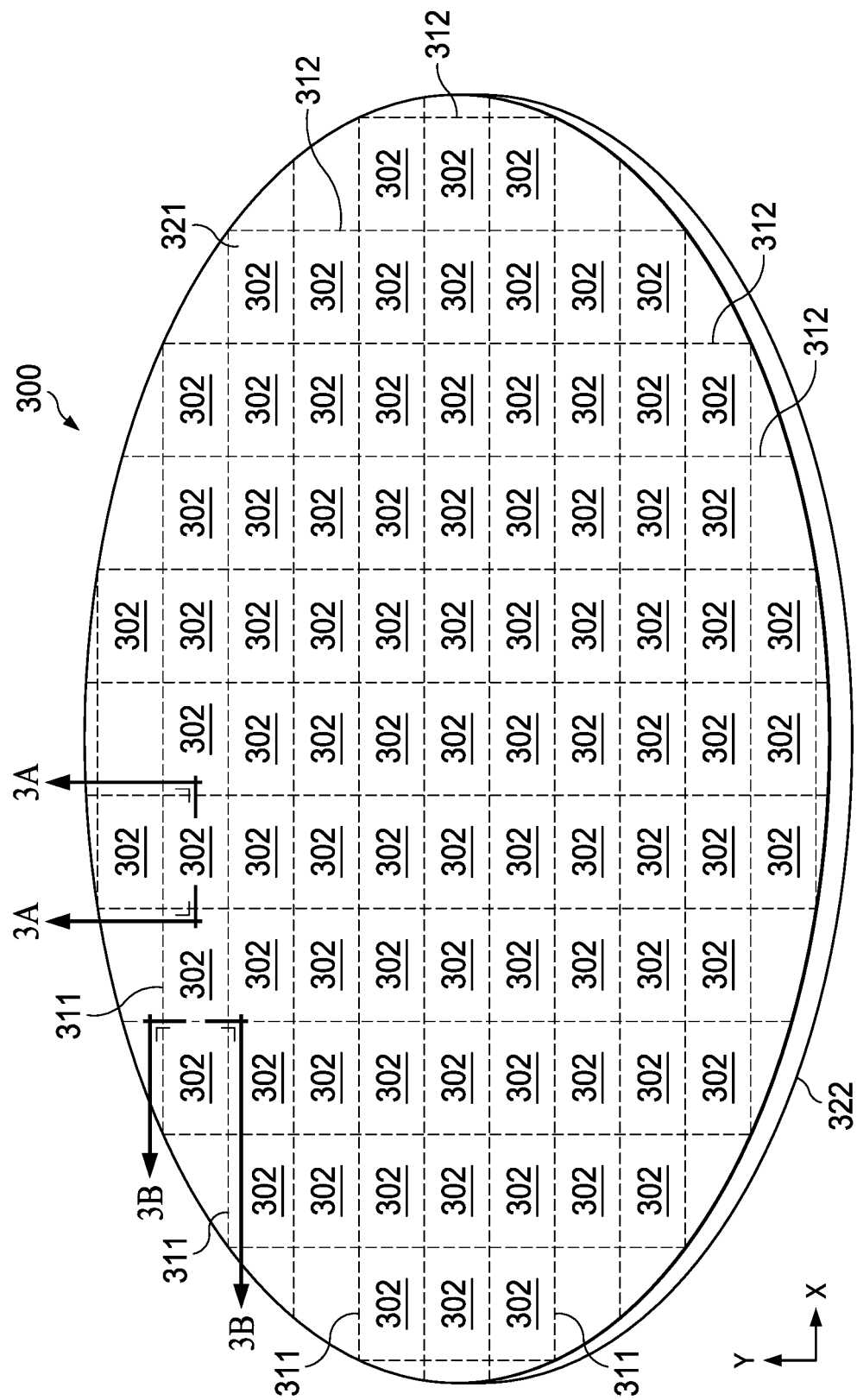
FIGS. 3-7 are perspective and partial sectional side elevation views of the electronic device of FIGS. 1-1B undergoing fabrication processing according to the method of FIG. 2.
Figure 3A:
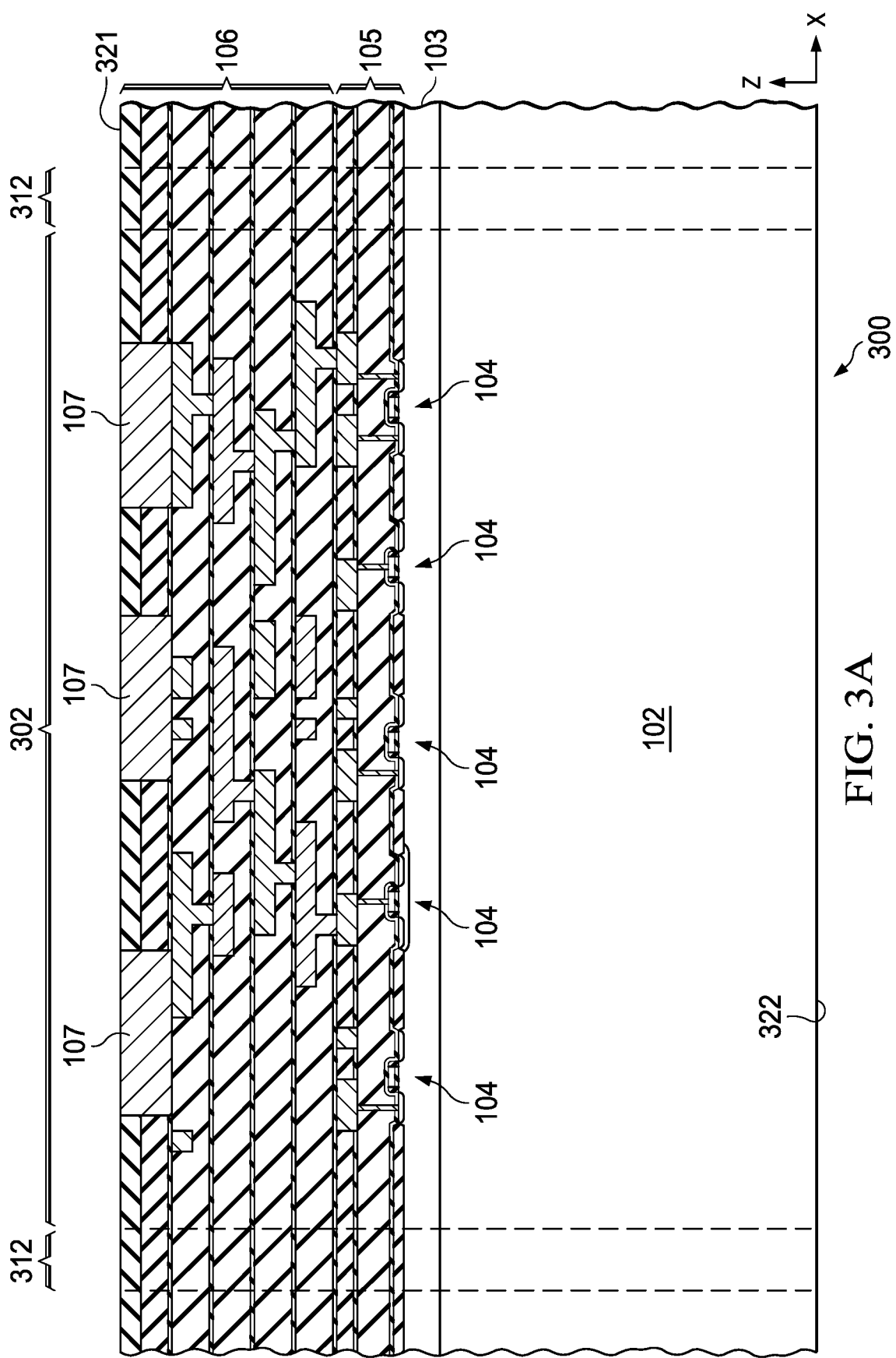
Figure 3B:
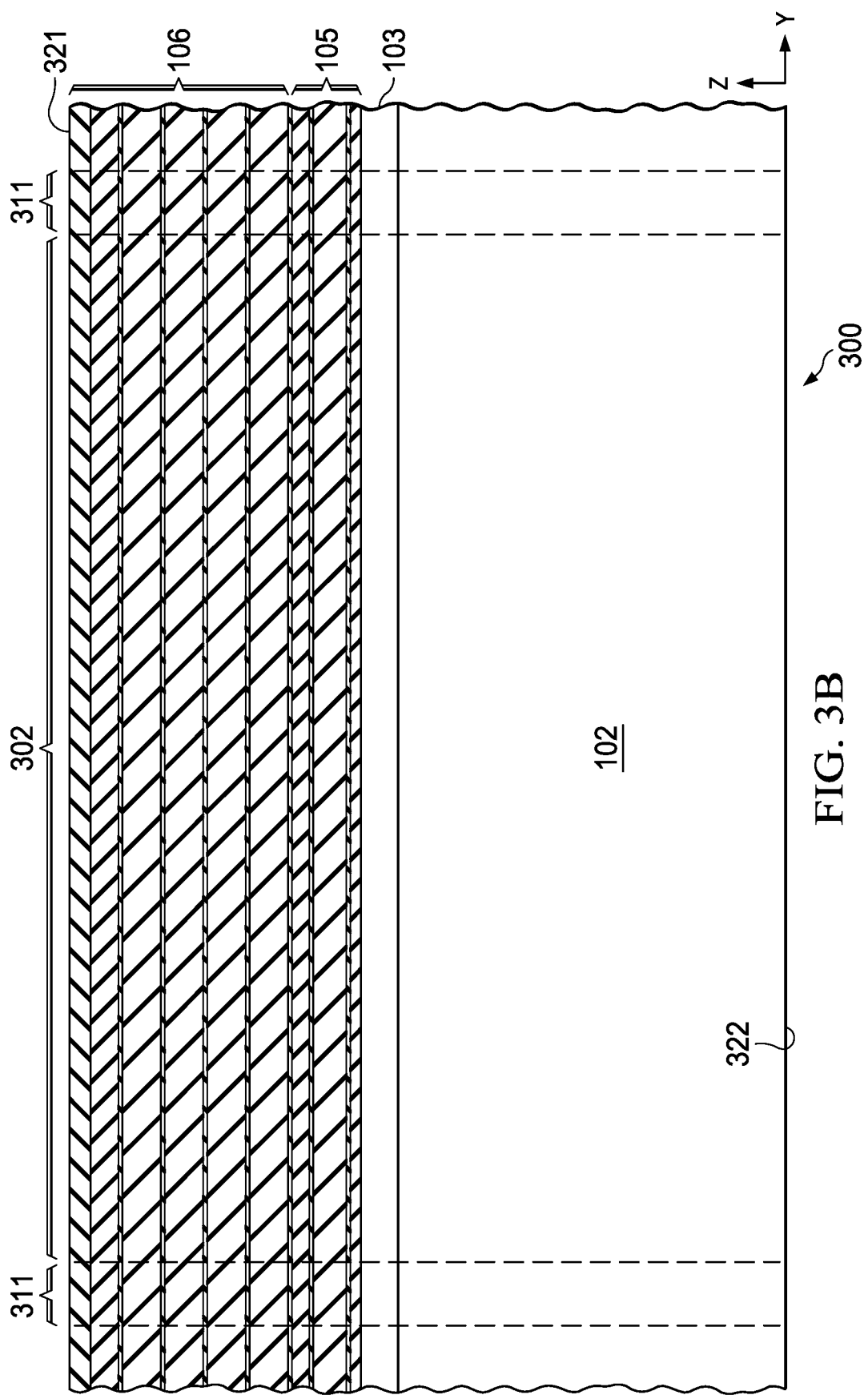

The method begins at 202 in FIG. 2 with fabrication of active circuits and metallization structures in a wafer. FIGS. 3, 3A and 3B show an example in which a wafer 300 includes multiple die regions 302 arranged in rows and columns. The wafer 300 includes scribe lines 311 and 312 extending in rows and columns along the respective first and second directions X and Y between adjacent die regions 302 of the wafer 300. The wafer 300 has a first or top side 321 and an opposite second or bottom side 322. FIG. 3A illustrates a partial sectional side elevation view of the wafer 300 taken along line 3A-3A of FIG. 3 illustrating a portion of one example die region 302 and scribe lines 312 along respective sides of the example die region 302. FIG. 3B shows a sectional side elevation view of the wafer 300 taken along line 3B-3B along one of the scribe lines 312. The wafer 300 includes the above-described semiconductor substrate layer 102, the semiconductor surface layer 103, the active circuit portion 105, the metallization structure 106, and the conductive features 107 of multiple respective die regions 302 in wafer form prior to semiconductor die separation.

Figure 4:
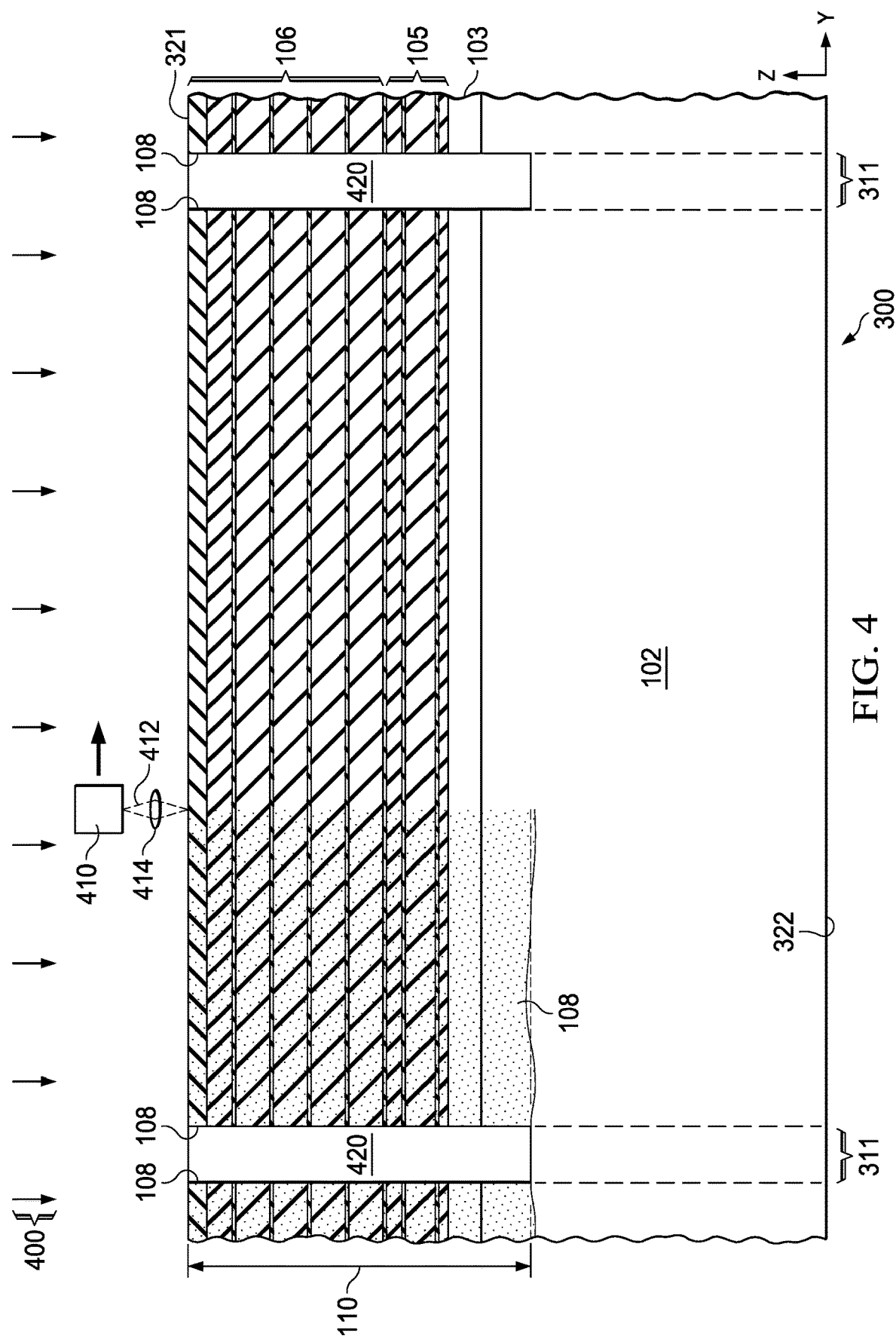

The method 200 continues at 204 and FIG. 2 with performing a laser ablation process. FIG. 4 shows one example (e.g., taken along line 3B-3B of FIG. 3 through a portion of one of the scribe lines 312), in which a laser ablation process 400 is performed using a laser 410 operative to generate and direct a laser beam 412 through a focus lens 414 along the third direction Z toward the top or first side 321 of the wafer 300. The laser ablation process 400 removes a portion of the wafer 300 to form a trench 420 in the scribe regions 311 and 312 between adjacent die regions 302 of the wafer 300. The laser ablation process 400 also creates the mark 108 (e.g., FIGS. 1-1A above) along the sidewalls of the trench 420, which remain after the individual semiconductor dies 101 have been separated from the wafer 300.

The laser ablation process 400 in one example scans the laser 410 along the first direction X in the direction of the scribe regions 311 and along the second direction Y in the direction of the scribe regions 312. In one example, the laser ablation process 400 is a multi-pass process. In certain implementations, multiple passes can be implemented to successively increase the depth of the trench 420 and/or a lateral width of the trench 420. As shown in FIG. 4, the trench 420 extends to an average depth distance 110 of 20 µm or more and 25 µm or less from the first side 131 of the wafer 300 toward the second side 132 of the wafer 300. In this or another example, the trench 420 extends laterally to an average width of 20 µm or more and 40 µm or less between the adjacent die regions 302 of the wafer 300. Shallower trench depth distances 110 and/or narrower trench widths can reduce the chance of successful die separation in subsequent wafer expansion (e.g., at 216 in FIG. 2), whereas deeper trench depth distances 110 and/or wider trenches can make the structure more vulnerable to mechanical stresses during wafer handling or transfer and/or during wafer probe testing operations (e.g., at 206 in FIG. 2) and thereby inhibit the ability to perform wafer probe testing prior to device separation at 218.

The example trench 420 includes trench segments in the scribe regions 311 along the first direction X and in the scribe regions 312 along the second direction Y that circumscribe the prospective rectangular die regions 302 of the wafer 300. In other examples, circular, curvilinear or other trench shapes can be used which circumscribe or surround the individual die regions 302. The trench 420 extends from the first side 131 of the wafer 300 towards the opposite second side 132, and the trench 420 extends through the metallization structure 106 and the active circuit portion 105 of the wafer 300. The bottom of the trench 420 is spaced apart from the second side 132 of the wafer 300 such that the individual die regions 302 are not separated from the wafer structure, and the wafer 300 can undergo wafer probe testing.

Figure 5:
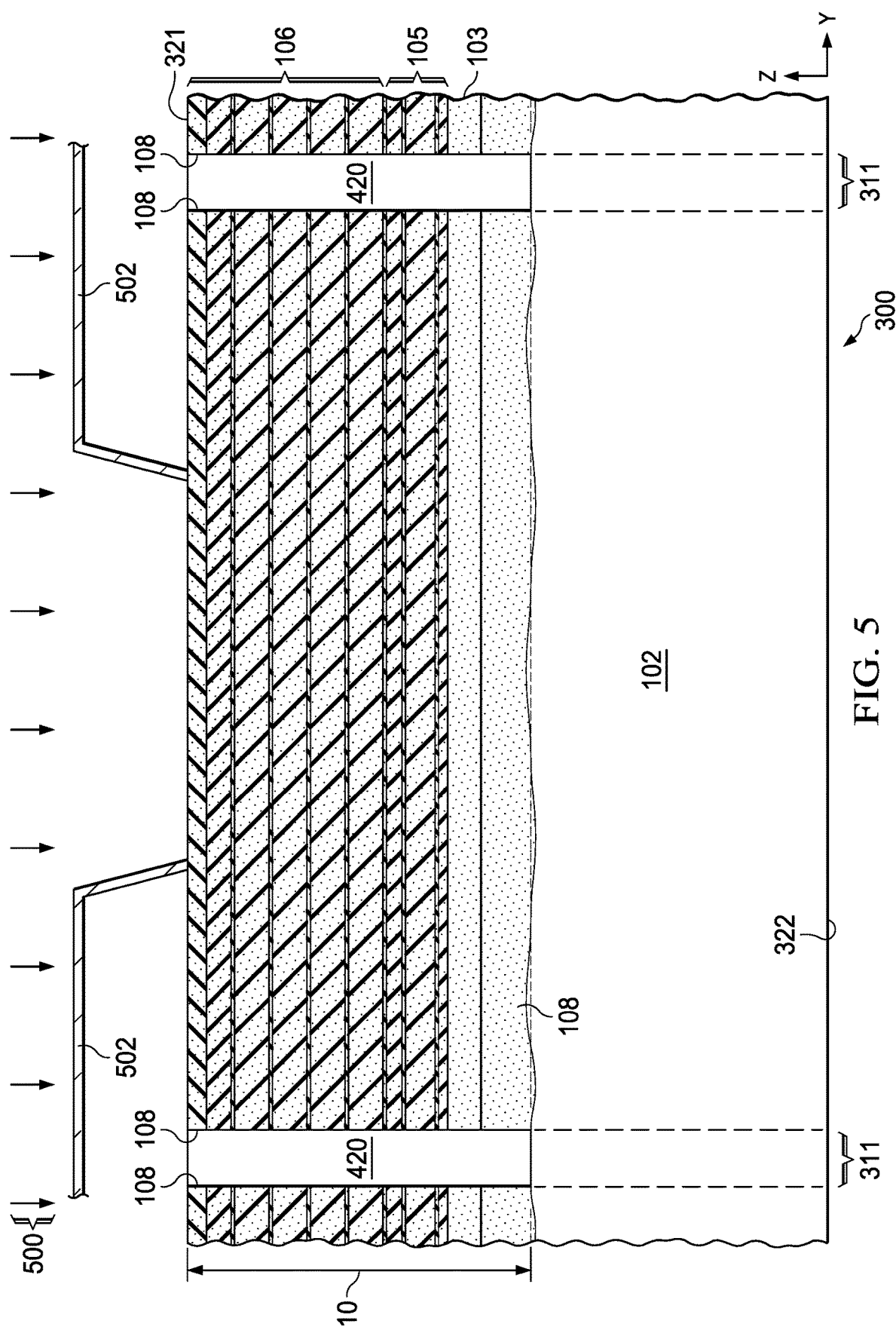
Figure 6:
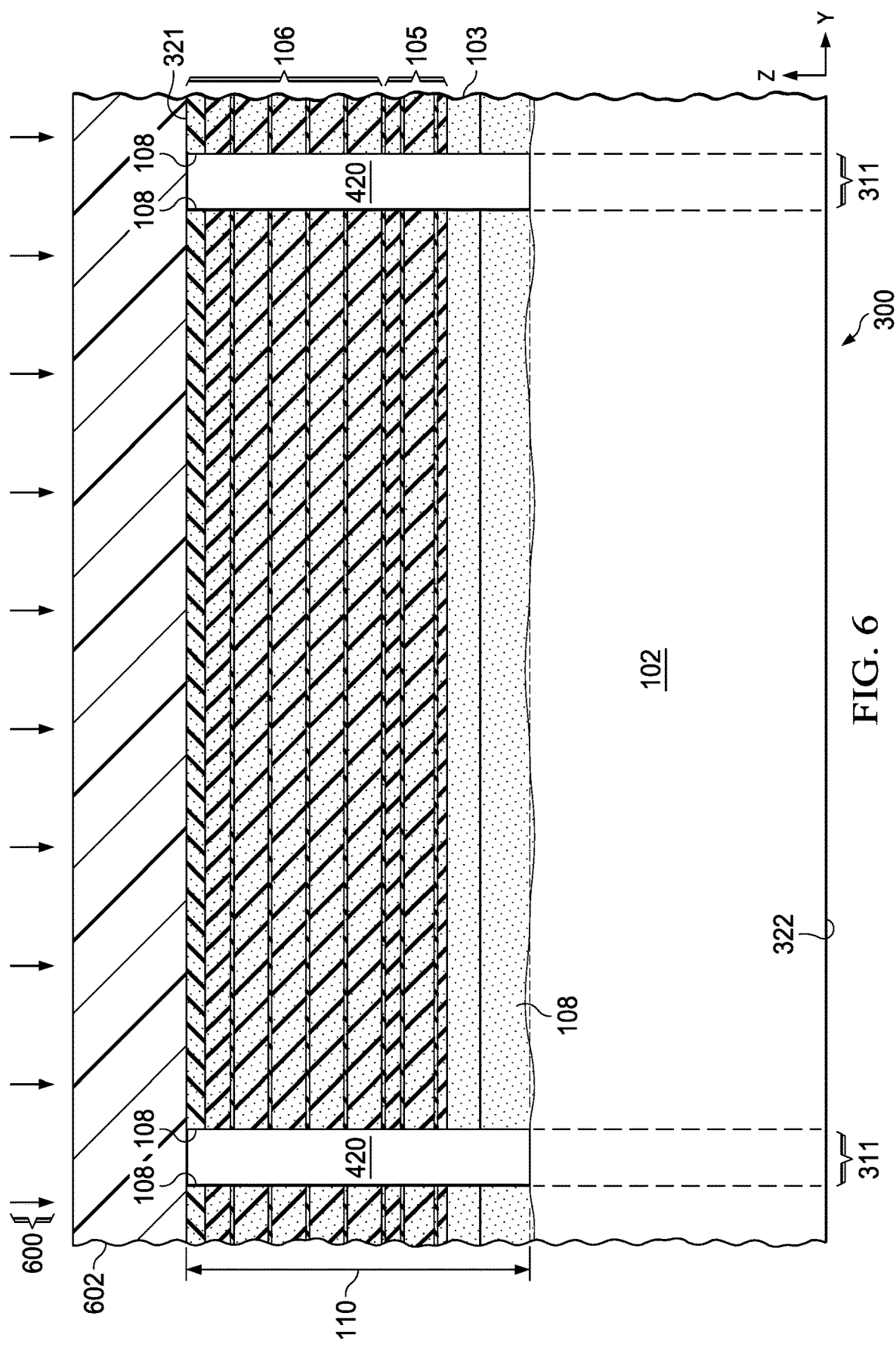
Figure 7:
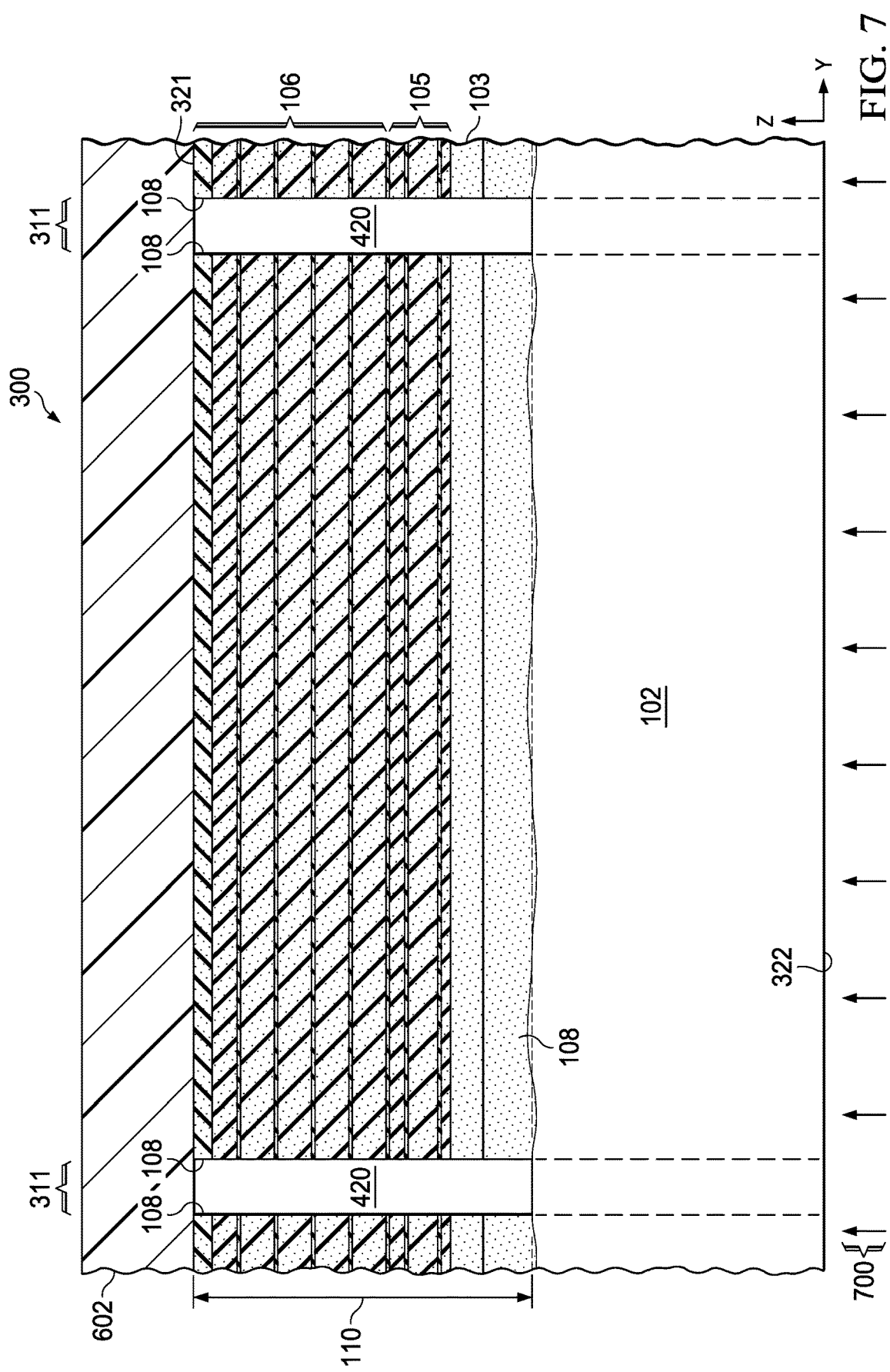

The method 200 continues at 206 in FIG. 2 with wafer probe testing. FIG. 5 shows one example in which a wafer probe is engaged with the wafer 300, with one or more conductive wafer probe needles 502 engaged with corresponding conductive structures (e.g., bond pads 107 in FIG. 3A above). After the laser ablation process 400, a wafer probe test 500 is performed as shown in FIG. 5 that tests the circuitry (e.g., transistors 104 in FIG. 3A) of the active circuit portion 105 of the wafer 300. In the illustrated example, back grind is then performed at 208 and 210 to reduce the thickness of the wafer 300 along the third direction Z. In another implementation, the back grinding operations are omitted. At 208, a back grind tape is adhered to the first or top side 321 of the wafer. FIG. 6 shows one example, in which a back grind tape 602 is adhered to the first side 321 of the wafer 300 using a process 600. At 210, the second or bottom side 322 of the wafer is ground using a grinding process. FIG. 7 shows one example, in which a grinding process 700 is performed that removes a portion of the second side 322 of the wafer 300 to provide a desired final wafer thickness.

Figure 8:
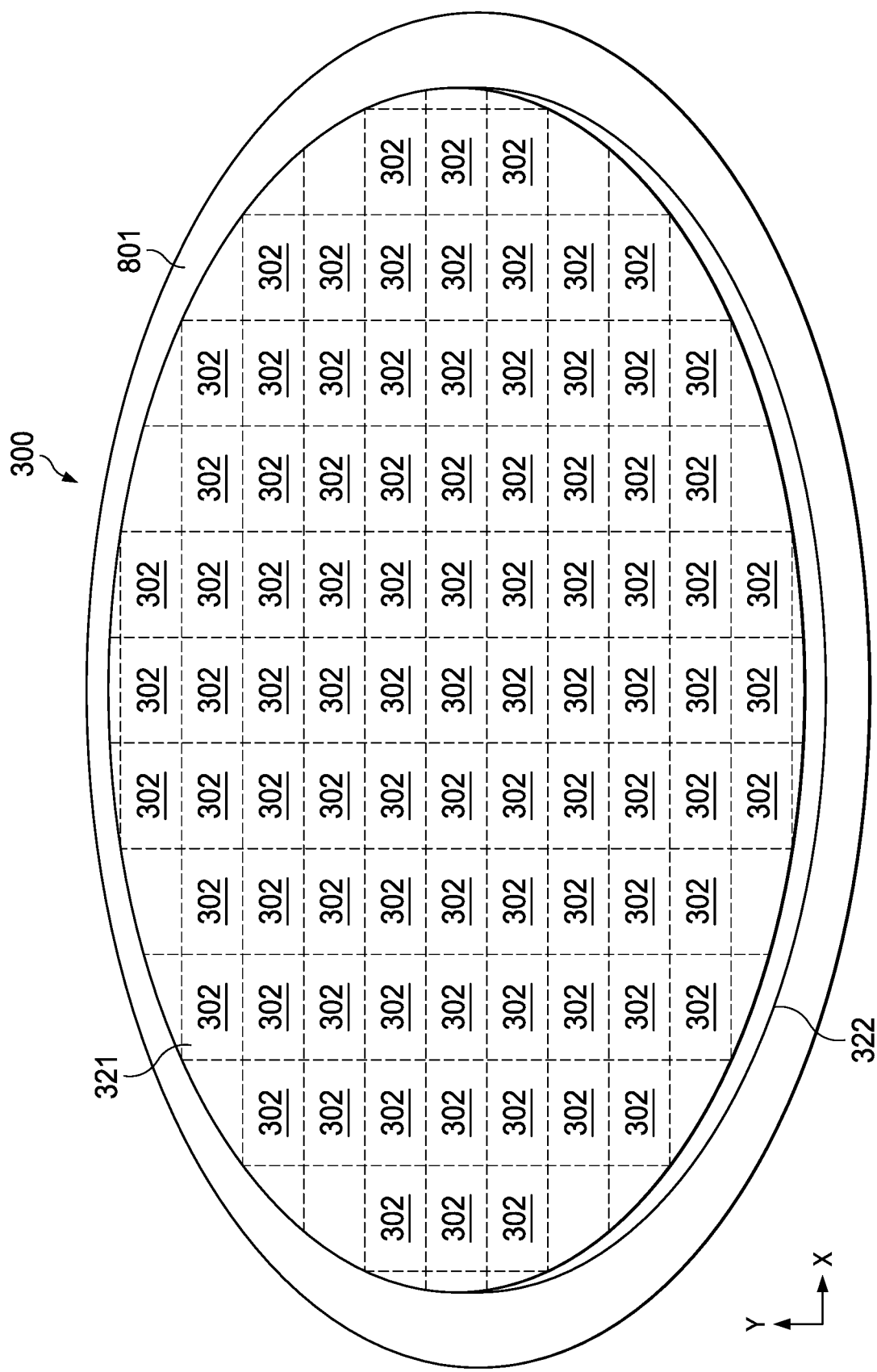
FIG. 8 is a perspective view of a wafer.
Figure 9:
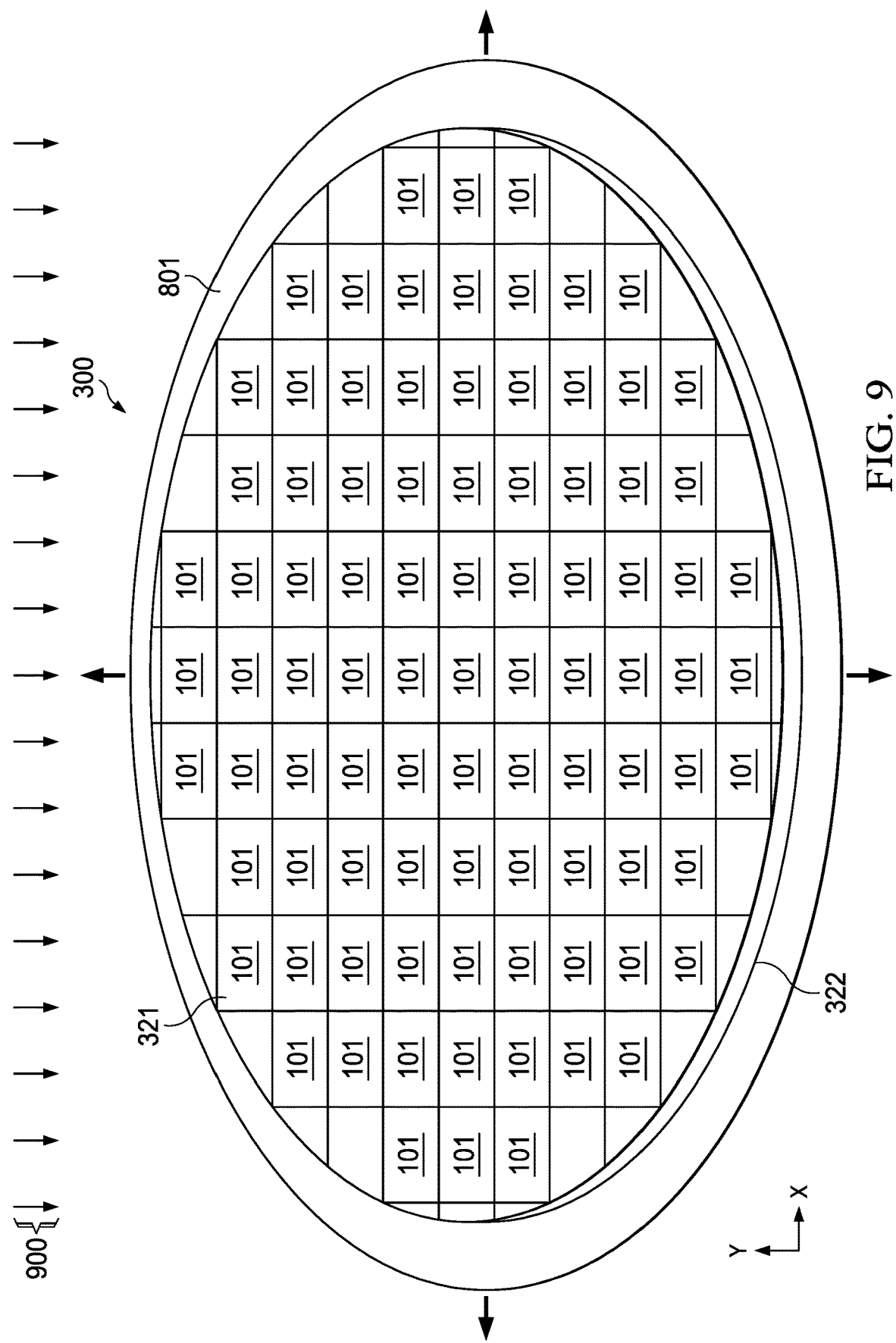
FIG. 9 shows a wafer expansion process.

At 212 in FIG. 2, the method 200 continues with adhering a dicing tape to the finished bottom or second side 322 of the wafer 300. At 214, the back grind tape 602 is removed from the first side 321 of the wafer 300. FIG. 8 shows a perspective view of one example, in which the back grind tape 602 has been removed from the first side 321 of the wafer 300, and a dicing tape 801 has been adhered to the second side 322 of the wafer 300. At 216, after the laser ablation process 400, the method 200 continues with wafer expansion. FIG. 9 shows one example, in which a wafer expansion process 900 is performed that separates the individual semiconductor dies 101 from the wafer 300. In one example, the wafer 300 is installed in an expander tool (not shown) that is configured to expand the wafer 300 along the first and second directions X and Y to separate individual dies 101 from the wafer 300. The expander tool stretches the dicing tape 801 at 216 to separate the individual dies 101 by a stretching or expansion process 900 that stretches the carrier tape 801 outward along the first and second directions X and Y as shown by the arrows in FIG. 9 to separate the individual dies 101 from the wafer 300. The die singulation processing is then complete, and the dies 101 can be transferred to a packaging operation for assembly into packaged electronic devices at 218 in FIG. 2. In one example, the packaging at 218 includes die attach processing to attach one of the individual dies 101 to a die attach pad or package substrate (not shown). One or more electrical connection processes are also performed at 218, for example, flip-chip die attach soldering and/or wire bonding to electrically connect one or more terminals or conductive features 107 of an individual die 101 to a circuit or conductive lead of the prospective electronic device 100. In addition, molding and package separation operations are performed during packaging at 218 to provide a finished packaged electronic device 100, for example, as shown in FIGS. 1-1B above.

In contrast to conventional laser dicing processes, the method 200 facilitates identification of any laser splash damage that may have occurred during the laser ablation dicing at 204 by the subsequent wafer probe testing 206 prior to final wafer expansion at 218. The use of the trench formation by laser ablation at 204 itself helps to mitigate laser splash damage compared to laser dicing, where the laser is applied to the wafer 300 only to form the initial trench 422 the depth 110, as opposed to using laser energy throughout the entire thickness of the wafer along the third direction Z. Moreover, the example method 200 can be tailored to control the laser power in order to mitigate laser splash damage, and any damage that occurs can be identified in the wafer probe testing at 206, thereby saving the cost of packaging damaged die areas prior to identification of laser splash damage. The method 200 thus helps improve product yield and reduce manufacturing cost compared to conventional laser dicing techniques.

Modifications are possible in the described examples, and other implementations are possible, within the scope of the claims.

What is claimed is:

1. A method of fabricating an electronic device, the method comprising:
   performing a laser ablation process that removes a portion of a wafer to form a trench in a scribe region between adjacent die regions of the wafer, the trench extending from a first side of the wafer toward an opposite second side of the wafer, the trench extending through a metallization structure and an active circuit portion of the wafer, and a bottom of the trench spaced apart from the second side of the wafer;

after the laser ablation process, performing a wafer probe test that tests circuitry of the active circuit portion of the wafer;

after the wafer probe test, performing a wafer expansion process that separates individual semiconductor dies from the wafer; and packaging one of the semiconductor dies in a package structure to form an electronic device.

2. The method of claim 1, further comprising, after the wafer probe test and before the wafer expansion process, performing a grinding process on the second side of the wafer.

3. The method of claim 2, wherein the laser ablation process is a multi-pass process that uses multiple passes of an ablation laser to successively increase the depth of the trench and/or a lateral width of the trench.

4. The method of claim 3, wherein the laser ablation process forms the trench to an average depth distance of 20 μm or more and 25 μm or less from the first side of the wafer toward the second side of the wafer.

5. The method of claim 2, wherein the laser ablation process forms the trench to an average depth distance of 20 μm or more and 25 μm or less from the first side of the wafer toward the second side of the wafer.

6. The method of claim 1, wherein the laser ablation process is a multi-pass process that uses multiple passes of an ablation laser to successively increase the depth of the trench and/or a lateral width of the trench.

7. The method of claim 6, wherein the laser ablation process forms the trench to an average depth distance of 20 μm or more and 25 μm or less from the first side of the wafer toward the second side of the wafer.

8. The method of claim 7, wherein the laser ablation process forms the trench to an average width of 20 μm or more and 40 μm or less between the adjacent die regions of the wafer.

9. The method of claim 1, wherein the laser ablation process forms the trench to an average depth distance of 20 μm or more and 25 μm or less from the first side of the wafer toward the second side of the wafer.

10. The method of claim 9, wherein the laser ablation process forms the trench to an average width of 20 μm or more and 40 μm or less between the adjacent die regions of the wafer.

11. The method of claim 1, wherein the laser ablation process forms the trench to an average width of 20 μm or more and 40 μm or less between the adjacent die regions of the wafer.

12. A method of separating semiconductor dies from a wafer, the method comprising:

performing a laser ablation process that removes a portion of a wafer to form a trench in a scribe region between adjacent die regions of the wafer, the trench extending from a first side of the wafer toward an opposite second side of the wafer, the trench extending through a metallization structure and an active circuit portion of the wafer, and a bottom of the trench spaced apart from the second side of the wafer; and after the laser ablation process, performing a wafer expansion process that separates individual semiconductor dies from the wafer.

13. The method of claim 12, wherein the laser ablation process forms the trench to an average depth distance of 20 μm or more and 25 μm or less from the first side of the wafer toward the second side of the wafer.

14. A method of fabricating an electronic device, the method comprising:

performing a laser ablation process that removes a portion of a wafer to form a trench in a scribe region between adjacent die regions of the wafer, the trench extending from a first side of the wafer toward an opposite second side of the wafer, the trench extending through a metallization structure and an active circuit portion of the wafer, and a bottom of the trench spaced apart from the second side of the wafer;

after the laser ablation process, performing a wafer probe test that tests circuitry of the active circuit portion of the wafer; and after the wafer probe test, performing a wafer expansion process.

15. The method of claim 14, further comprising, after the wafer probe test and before the wafer expansion process, performing a grinding process on the second side of the wafer.

16. The method of claim 15, wherein the laser ablation process is a multi-pass process that uses multiple passes of an ablation laser to successively increase the depth of the trench and/or a lateral width of the trench.

17. The method of claim 16, wherein the laser ablation process forms the trench to an average depth distance of 20 μm or more and 25 μm or less from the first side of the wafer toward the second side of the wafer.

18. The method of claim 15, wherein the laser ablation process forms the trench to an average depth distance of 20 μm or more and 25 μm or less from the first side of the wafer toward the second side of the wafer.

19. The method of claim 14, wherein the laser ablation process is a multi-pass process that uses multiple passes of an ablation laser to successively increase the depth of the trench and/or a lateral width of the trench.

20. The method of claim 19, wherein the laser ablation process forms the trench to an average depth distance of 20 μm or more and 25 μm or less from the first side of the wafer toward the second side of the wafer.

21. The method of claim 20, wherein the laser ablation process forms the trench to an average width of 20 μm or more and 40 μm or less between the adjacent die regions of the wafer.

22. The method of claim 14, wherein the laser ablation process forms the trench to an average depth distance of 20 μm or more and 25 μm or less from the first side of the wafer toward the second side of the wafer.

23. The method of claim 22, wherein the laser ablation process forms the trench to an average width of 20 μm or more and 40 μm or less between the adjacent die regions of the wafer.

24. The method of claim 14, wherein the laser ablation process forms the trench to an average width of 20 μm or more and 40 μm or less between the adjacent die regions of the wafer.

* * * * *